United States Patent [19]

Baliga

[11] Patent Number: 4,641,174
[45] Date of Patent: Feb. 3, 1987

[54] PINCH RECTIFIER

[75] Inventor: Bantval J. Baliga, Saratoga, N.Y.

[73] Assignee: General Electric Company, Schenectady, N.Y.

[21] Appl. No.: 510,520

[22] Filed: Aug. 8, 1983

[51] Int. Cl.[4] .............................................. H01L 29/12
[52] U.S. Cl. ....................................... 357/58; 257/15; 257/22; 257/86
[58] Field of Search ....................... 357/37, 22, 15, 38, 357/58, 86; 363/127

[56] References Cited

U.S. PATENT DOCUMENTS

| | | | |
|---|---|---|---|
| 3,274,461 | 9/1966 | Teszner | 357/22 |
| 3,588,671 | 6/1971 | Deboo | 363/127 |
| 3,828,230 | 8/1974 | Nishizawa | 357/22 |
| 3,829,882 | 8/1974 | Arai | 357/22 |
| 3,953,879 | 4/1976 | O'Connor et al. | 357/22 |
| 3,982,264 | 9/1976 | Ishitani | 357/22 |
| 4,037,245 | 7/1977 | Ferro | 357/37 |
| 4,134,123 | 1/1979 | Shannon | 357/15 |
| 4,170,019 | 10/1979 | Hysell | 357/22 |
| 4,215,356 | 7/1980 | Kato | 357/22 |
| 4,236,166 | 11/1980 | Cho et al. | 357/15 |

FOREIGN PATENT DOCUMENTS

| | | | |
|---|---|---|---|
| 0024465 | 2/1977 | Japan | 357/15 M |
| 0002672 | 1/1981 | Japan | 357/15 G |
| 56-37683 | 4/1981 | Japan | 357/86 |
| 0035473 | 4/1981 | Japan | 357/15 |
| 1208266 | 10/1970 | United Kingdom | 357/15 M |

OTHER PUBLICATIONS

IBM Technical Digest, vol. 23, #10, p. 4527, Mar. 1981, by Matino "FET Rectifier Circuit".
S. Korea Institute of Electronic Engineers, vol. 15, #1, by Min Young Ki, Mar. 1978, pp. 23-26.
D. Kahng, editor *Silicon Integrated Circuits-Part B*, New York: Academic Press (1981), pp. 185-209.
J. M. Shannon, "Control of Schottky Barrier Height Using Highly Doped Surface Layers," Solid State Electronics, vol. 19(1976), pp. 537-543.
S. Ashok, et al., "Modification of Schottky Barriers in Silicon by Reactive Ion Etching with $NF_3$", Appl. Phys. Lett., vol. 42(15 Apr. 1983), pp. 687-689.

*Primary Examiner*—William D. Larkins
*Assistant Examiner*—Mark Prenty
*Attorney, Agent, or Firm*—John R. Rafter; James C. Davis, Jr.; Marvin Snyder

[57] ABSTRACT

A high speed semiconductor pinch rectifier attains low forward voltage drop and low reverse leakage current by utilizing depletion region pinch-off of conduction channels in a high-resistivity region. In a preferred form, the pinch rectifier additionally utilizes a Schottky barrier contact so as to facilitate device fabrication.

15 Claims, 14 Drawing Figures

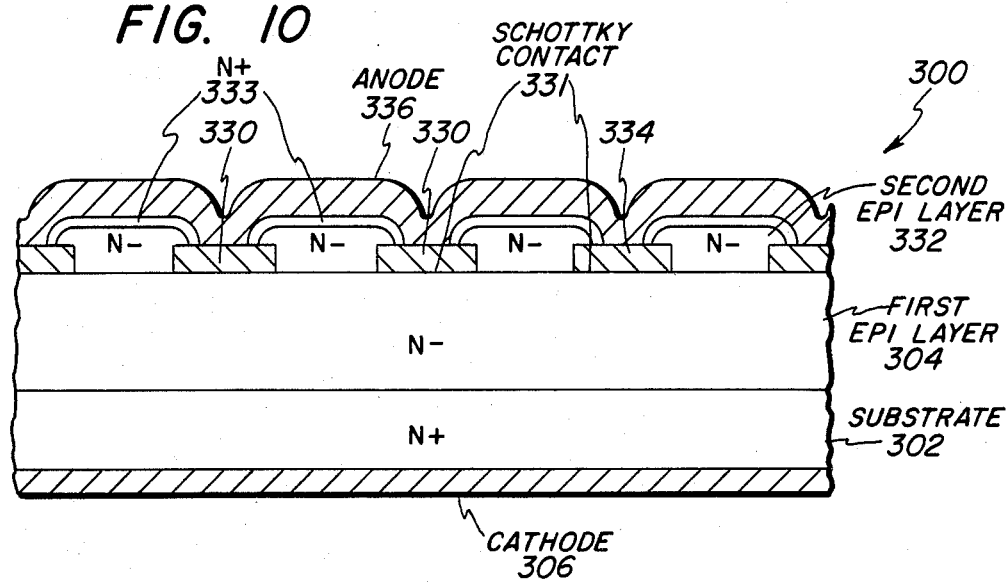
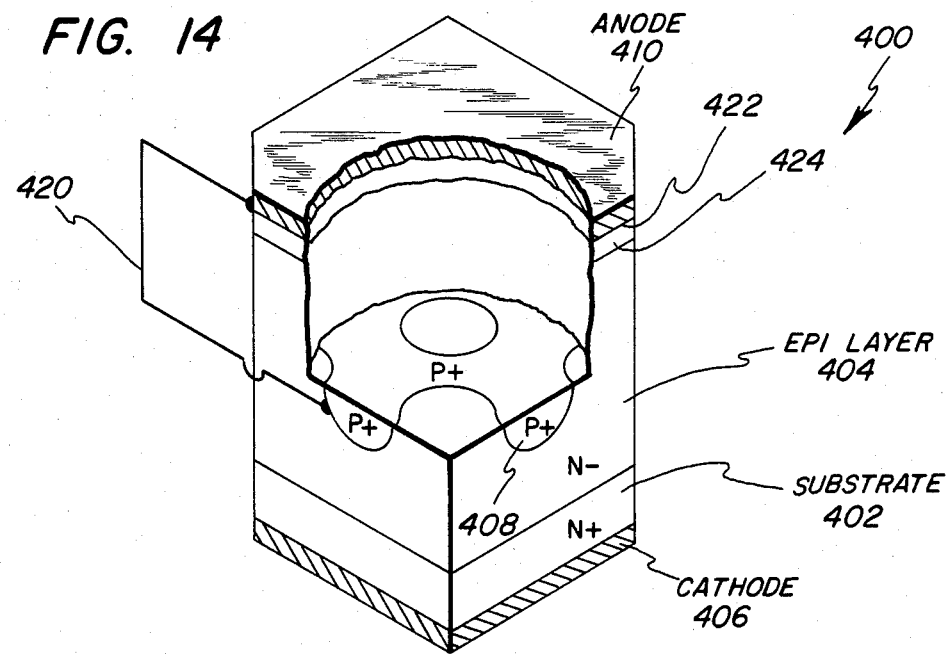

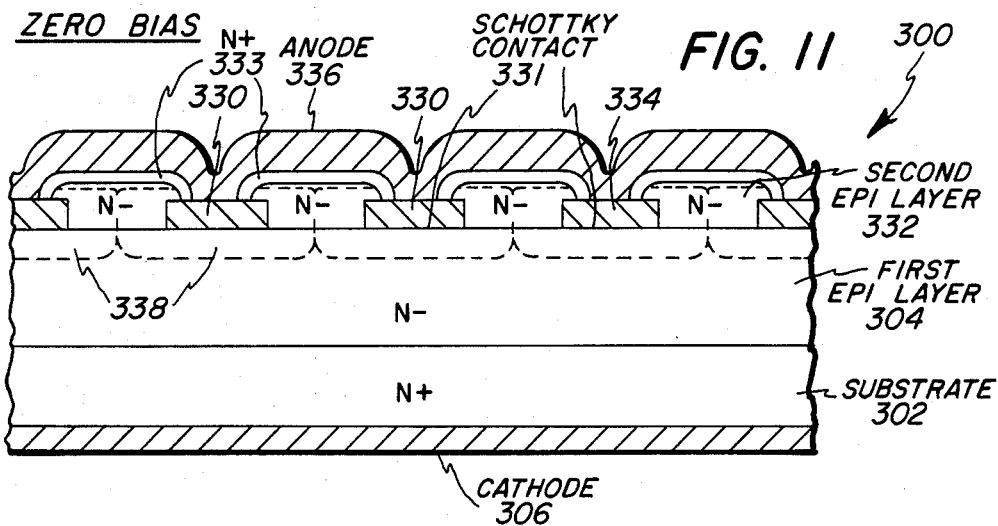
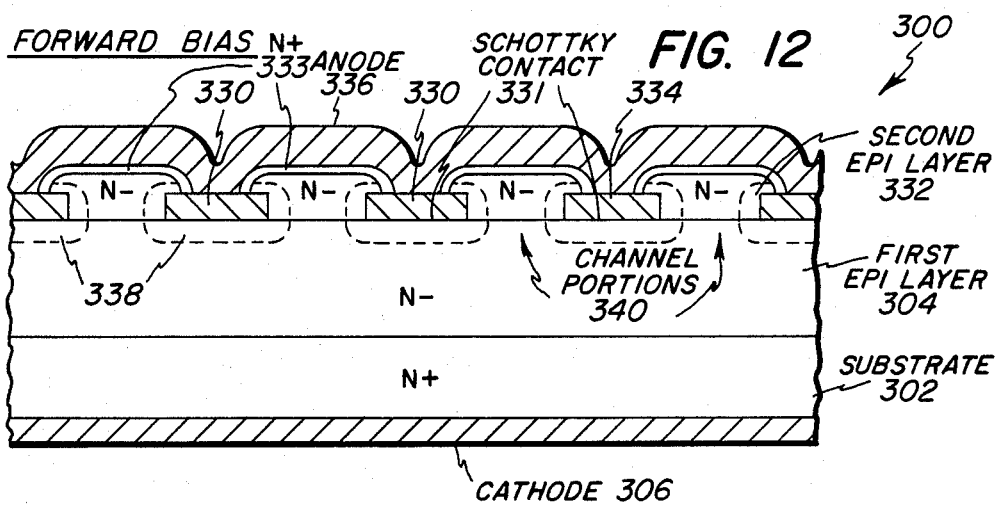
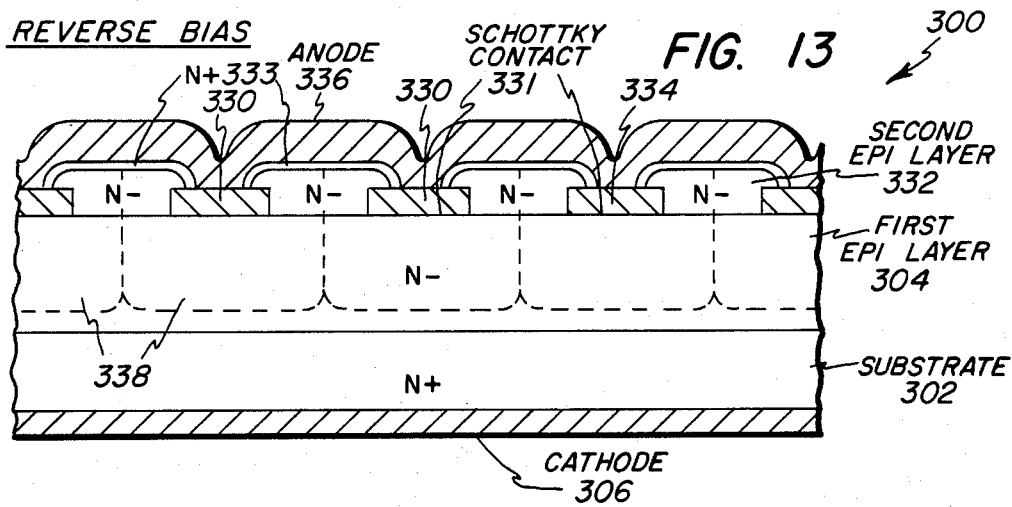

PINCH RECTIFIER

BACKGROUND AND SUMMARY OF THE INVENTION

My invention relates to rectifiers and, more particularly, to two-terminal semiconductor rectifiers especially suitable for high-speed power-switching operation.

Rectifiers are electrical devices that are particularly adapted to rectifying current, that is converting alternating current to direct current. More specifically, rectifiers exhibit a very low resistance to current flow when forward-biased (i.e., anode biased more positive than cathode) and a very high resistance to current flow when reverse-biased (i.e., anode biased more negative than cathode).

One known form of rectifier is a semiconductor p-i-n diode, which typically comprises semiconductor layers arranged as P+/N/N+. The "P+" and "N+" layers constitute semiconductor regions that are highly-doped with P-conductivity type dopant and with N-conductivity type dopant, respectively. The intermediate "N" layer is relatively lightly doped with N-conductivity type dopant so that it can support high reverse voltages without current conduction.

In operation of a p-i-n diode, a forward bias of typically 0.8 to 1.0 volts (for silicon devices) is required to initiate current conduction. This forward voltage drop of 0.8 to 1.0 volts undesirably results in a high level of waste heat generation during forward conduction; a rectifier with a lower forward voltage drop would thus be desirable so as to limit waste heat generation.

A p-i-n diode is a "bipolar" device in that current flow in the diode is due to current carriers of both types, that is, both holes and electrons. Relative to unipolar devices in which current flow is due to only hole or electron flow, bipolar devices are slow at turning off, since, after turn-off initiation in a bipolar device, there is a delay during which minority current carriers (i.e., holes in the "N" region of a typical p-i-n diode) recombine with electrons. The slower turn-off speed of bipolar devices make them less suitable than unipolar devices for high-speed switching applications.

A rectifier that was developed to provide a lower forward voltage drop and a faster turn-off speed than a p-i-n diode is the Schottky diode. In a typical Schottky diode, a Schottky barrier contact is formed between a first electrode and a first N-conductivity type layer of semiconductor material. The first layer has a dopant concentration per cubic centimeter below about $1 \times 10^{17}$, at least for N-conductivity type silicon. A Schottky barrier contact exhibits a potential barrier to current flow and, like a p-i-n diode, must be forward biased to initiate current flow. If the first layer had a dopant concentration in excess of the foregoing value, an ohmic contact between the first electrode and first layer would result, which does not exhibit a potential barrier to current flow. In the foregoing Schottky diode, an ohmic contact is formed between a second N-conductivity type layer of more highly doped semiconductor material adjoining the first layer and a second electrode.

Although Schottky diodes exhibit lower forward voltage drops and faster turn-off speeds than p-i-n diodes, this is at the expense of exhibiting high reverse leakage currents, which increase significantly for increasing values of reverse voltage.

Accordingly, it is an object of my invention to provide a rectifier that attains a low forward voltage drop and fast turn-off speed without exhibiting a high level of reverse leakage current.

A further object of my invention is to provide a rectifier that is particularly suitable for high-speed power-switching applications.

A still further object of my invention is to provide a unipolar semiconductor rectifier of low forward voltage drop and low reverse leakage current that can be fabricated using conventional semiconductor processing techniques.

The foregoing objects are attained in a pinch rectifier which, in a preferred embodiment, includes an N+ substrate layer with an N− epitaxial layer grown thereon. Adjoining the upper portion of the N− epitaxial layer is a current pinch-off means embodied as a plurality of P+ region portions spaced from each other so as to define between adjacent P+ region portions respective conduction channel portions in the N− epitaxial layer. An anode is provided atop both the current pinch-off means and the conduction channel portions in the N− epitaxial layer. The anode forms an ohmic contact with the channel pinch-off means, but forms a Schottky barrier contact with the conduction channel portions in the N− epitaxial layer.

The current pinch-off means is effective to induce depletion region portions in the N− epitaxial layer extending therein from the P+ region portions, respectively. The P+ region portions of the current pinch-off means are spaced sufficiently near each other that the induced depletion region portions in the N− epitaxial layer merge together so as to pinch off the conductive channel portions upon biasing of the pinch rectifier with a sufficient reverse voltage. At reverse voltages of lower magnitude, the Schottky barrier contact between the anode and the N− epitaxial layer prevents current conduction by the pinch rectifier.

One further embodiment of my invention employs a conductive material for the current pinch-off means, rather than the above-described P+ region portions, which material forms a Schottky barrier contact with the N− epitaxial layer. A still further embodiment of my invention includes a highly-doped N conductivity type region sandwiched between the anode and the N− epitaxial layer so that the anode forms an ohmic contact to the N− epitaxial layer, rather than the Schottky barrier contact described above with respect to the preferred embodiment.

BRIEF DESCRIPTION OF THE DRAWINGS

While this specification concludes with claims setting forth the features of my invention which I believe to be novel, it is believed that the invention, together with further objects and advantages thereof, will be best understood from considering the following description in light of the drawings, in which:

FIG. 10 is a schematic view in cross section of a portion of a pinch rectifier in accordance with a still further embodiment of my invention;

FIGS. 11-13 are views similar to FIG. 10 illustrating the electrical condition of the pinch rectifier of FIG. 10 under various conditions of device biasing; and FIG. 14 is a three-dimensional view of a fragmentary portion of a pinch rectifier in accordance with an alternative embodiment of my invention.

DESCRIPTION OF THE PREFERRED EMBODIMENTS

Figure 1:
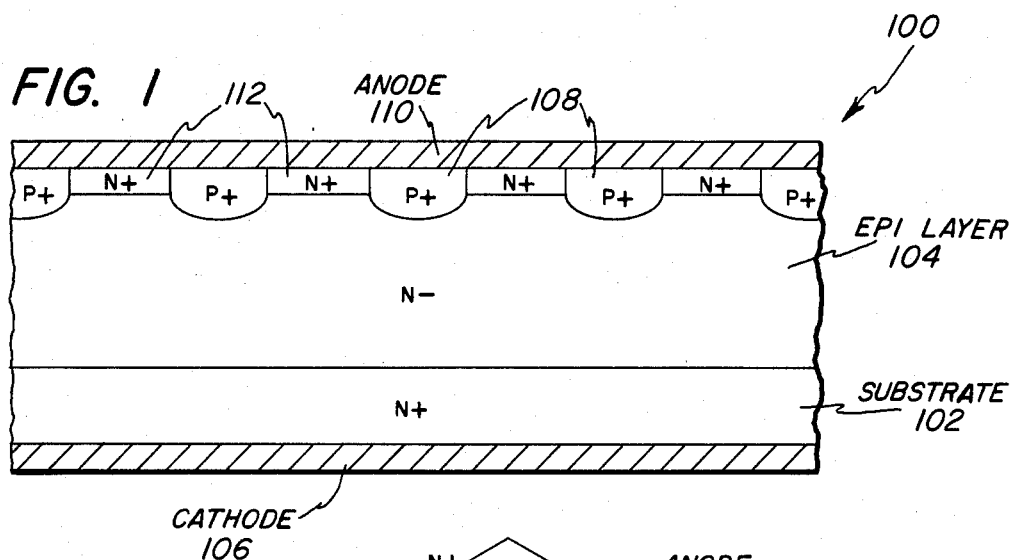
FIG. 1 is a schematic view in cross section of a portion of a pinch rectifier in accordance with an embodiment of my invention.

There is shown in FIG. 1 a cross-section of a pinch rectifier 100 in accordance with a first embodiment of my invention. Pinch rectifier 100 includes first and second semiconductor layers 102 and 104, preferably of silicon, which are doped to N conductivity type. First layer 102 preferably comprises a bulk substrate that is highly doped to increase its conductivity. Second layer 104 preferably comprises a lightly doped layer expitaxially grown on substrate layer 102, the thickness and doping concentration of layer 104 determining the reverse breakdown voltage of rectifier 100 in a manner that will be apparent to those skilled in the art. Underlying substrate 102 is an electrode 106, such as aluminum, which constitutes the cathode of pinch rectifier 100 and which forms an ohmic contact with highly-doped layer 102.

In accordance with my invention, pinch rectifier 100 includes a plurality of semiconductor region portions 108 adjoining the upper portion of epitaxially layer 104 and being highly doped to P conductivity type. P+ region portions 108 constitute what are referred to herein as "current pinch-off means", the purpose of which will be described below in connection with FIGS. 3-5. Adjoining each of P+ region portions 108 is a further electrode 110, such as deposited aluminum, which constitutes the anode of pinch rectifier 100. P+ region portions 108 have a dopant concentration per cubic centimeter preferably in excess of about $1 \times 10^{18}$ so that anode 110 forms an ohmic contact with P+ region portions 108.

Pinch rectifier 100 further includes third semiconductor layer portions 112 sandwiched between anode 110 and epitaxial layer 104 and which are highly doped to N conductivity type so that anode 110 forms an ohmic contact with epitaxial layer 104.

Figure 2:
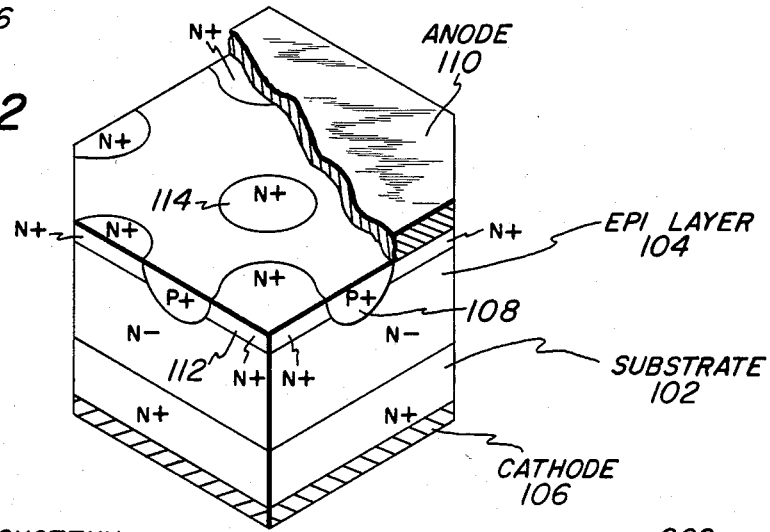
FIG. 2 is a three-dimensional view of a fragmentary portion of the pinch rectifier of FIG. 1.

The preferred arrangement of P+ region portions 108 and third layer portions 112 is depicted in FIG. 2, illustrating a three-dimensional, hexagonally shaped, fragmentary view of pinch rectifier 100, with part of anode layer 110 removed to facilitate viewing of details of the rectifier. In this preferred arrangement, N+ region portions 112 comprise a plurality of individual regions arranged in a hexagonal, closely spaced format, that is, with N+ region portion 114, for example, being symmetrically surrounded by six other like portions. P+ region portions 108 accordingly comprise an interconnected region with symmetrically interposed N+ region portions 112. Other geometries may be employed, however, for example, with N+ region portions 12 comprising square or parallel, elongated regions.

Figure 3:
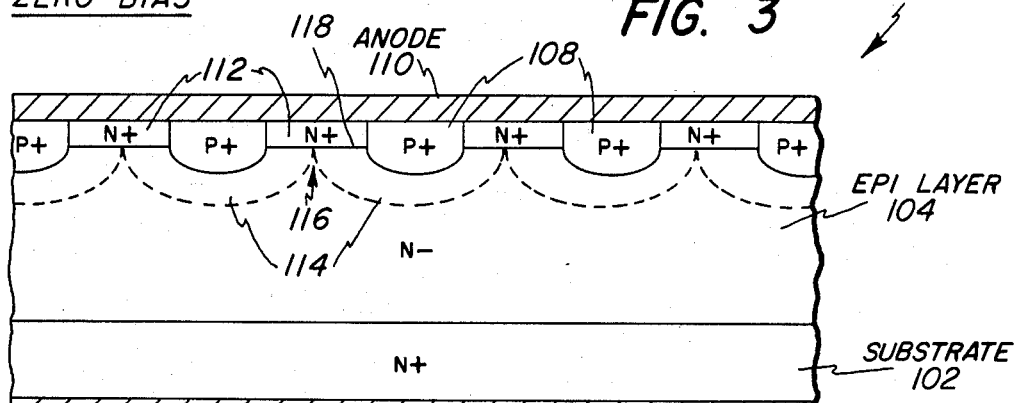
FIGS. 3–5 are views similar to FIG. 1 illustrating the electrical condition of the pinch rectifier of FIG. 1 under various conditions of device biasing.
Figure 4:
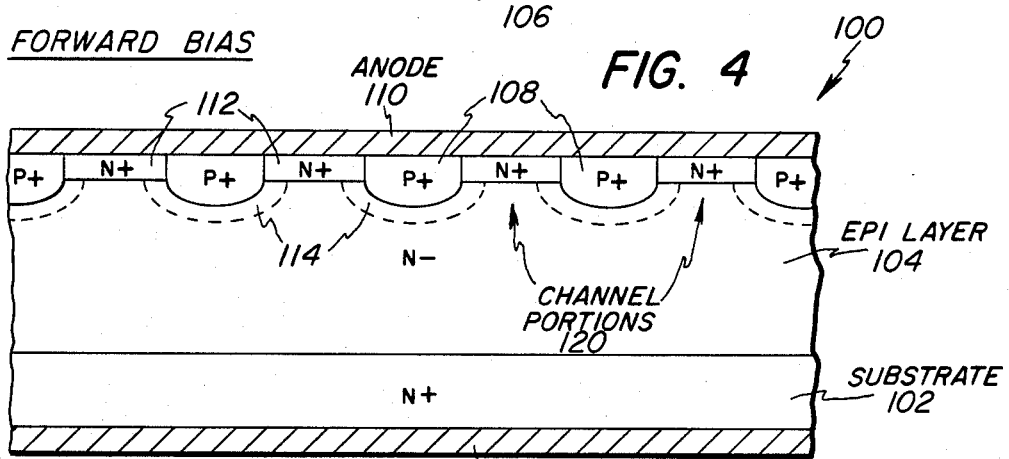
Figure 5:
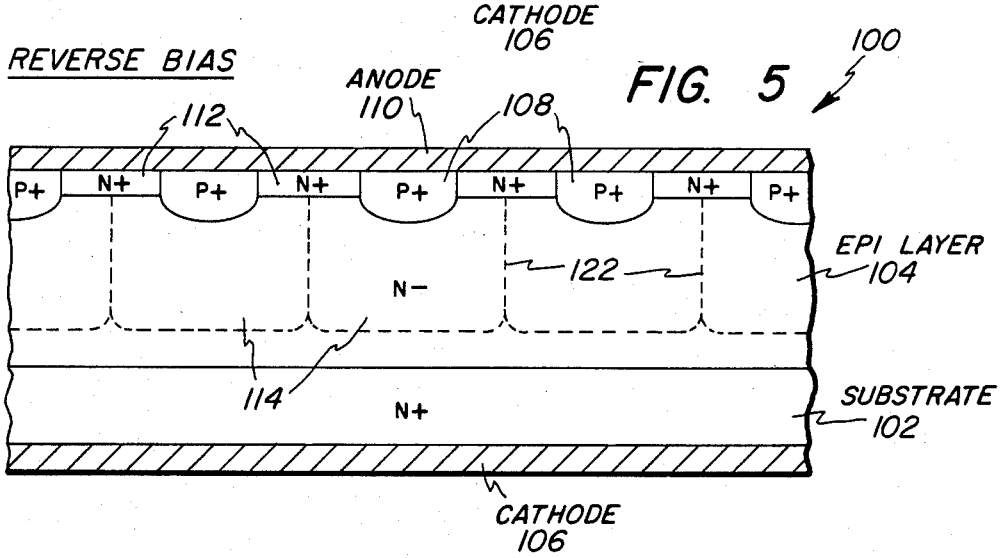

The functioning of P+ region portions 108 of FIGS. 1 or 2 can be more fully appreciated by considering the operation of pinch rectifier 100 as illustrated in FIGS. 3-5, discussed as follows.

FIG. 3 illustrates the electrical condition of pinch rectifier 100 when such rectifier is biased with zero voltage, that is, with anode 110 electrically shorted to cathode 106. In this zero bias condition, P+ region portions 108 induce in epitaxial layer 104 depletion region portions 114 respectively extending into layer 104 from P+ region portions 108, which portions 114 arise from the inherent potential difference between the more highly doped P+ portions 108 and the opposite conductivity type N− layer 104. Adjacent depletion region portions 114 merge together at a location indicated by an arrow 116, preferably at interface 118 between N+ region portions 112 and epitaxial layer 104. This requires N+ region portions 112 to be of sufficiently small diameter, typically of 0.6 microns, at least with P+ region portions doped to $1 \times 10^{18}$ per c.c. and N− epitaxial region 104 doped to $10^{16}$ (per c.c.). It is not crucial that adjacent depletion region portions 114 merge at interface 118; however, if these depletion region portions 114 do not merge at interface 118, a higher than ideal reverse leakage current will result, and if adjacent depletion region portions 114 are merged at zero bias and also at low forward bias voltages (that is with anode 110 biased slightly more positive than cathode 106), a higher than ideal forward voltage drop will result.

FIG. 4 illustrates the electrical condition of pinch rectifier 100 when forward biased. In this forward-bias condition, depletion region portions 114 are diminished from their size with pinch rectifier 100 under a zero biased condition, as illustrated in FIG. 3. In FIG. 4, it can be appreciated that adjacent depletion region portions 114 do not merge but instead are spaced from each other so as to define conduction channel portions 120 in epitaxial layer 104 between adjacent depletion region portions 114. Since channel portions 120 are not depleted, they are able to conduct current through pinch rectifier 100.

FIG. 5 illustrates operation of pinch rectifier 100 when it is reversed biased, that is, with anode 110 biased with a negative voltage with respect to cathode 106. Under this reverse-biased condition, adjacent depletion region portions 114 are merged together, as at 122, so as to pinch-off conduction channel portions 120, which are shown in FIG. 4. Accordingly, pinch rectifier 100 does not conduct current while in its reverse-biased condition, except for an extremely low level of reverse leakage current typically on the order of 10 microamperes, at least until pinch rectifier 100 is sufficiently reverse-biased to cause device breakdown (that is, uncontrolled current conduction due to avalanche breakdown).

Figure 6:
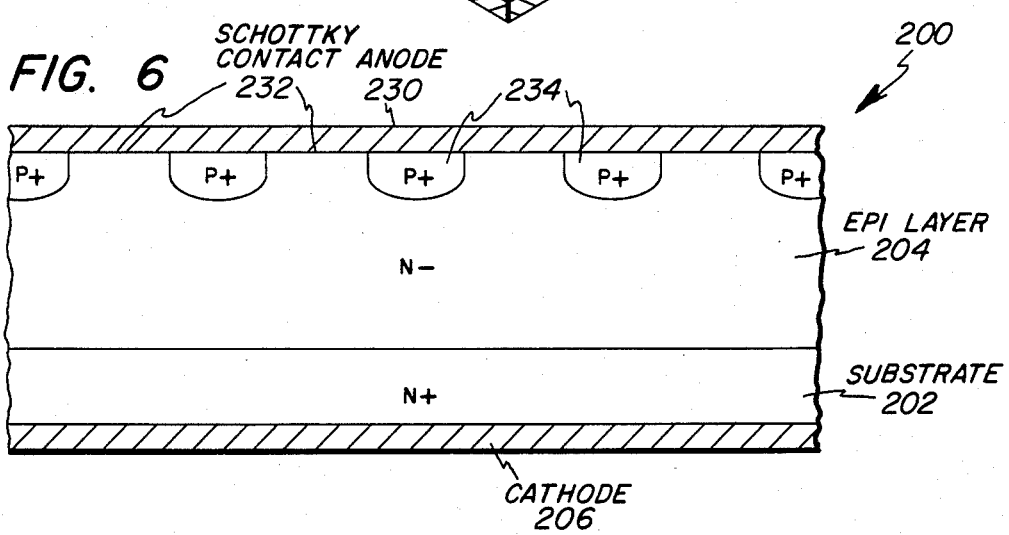
FIG. 6 is a schematic view in cross section of a portion of a pinch rectifier in accordance with a further embodiment of my invention.

Turning to FIG. 6, there is illustrated a portion of a pinch rectifier 200 in accordance with a further embodiment of my invention. In pinch rectifier 200, substrate layer 202, epitaxial layer 204, and cathode 206 suitably are essentially identical to substrate layer 102, epitaxial layer 104, and cathode layer 106, respectively, of pinch rectifier 100 (FIG. 1).

In pinch rectifier 200 the conductive material used to implement anode 230 is selected so as to form Schottky barrier contact portions 232 with epitaxial layer 204. A suitable material for anode 230 is, by way of example, aluminum or silicide which is highly-doped to either P or N conductivity type. The presense of Schottky barrier contact portions 232 results in the fabrication of P+ region portions 234 being easier than the fabrication of P+ region portions 108 of pinch rectifier 100 (FIG. 1), as will become apparent from the following discussion of FIGS. 7-9, pertaining to the operation of pinch rectifier 200.

Figure 7:
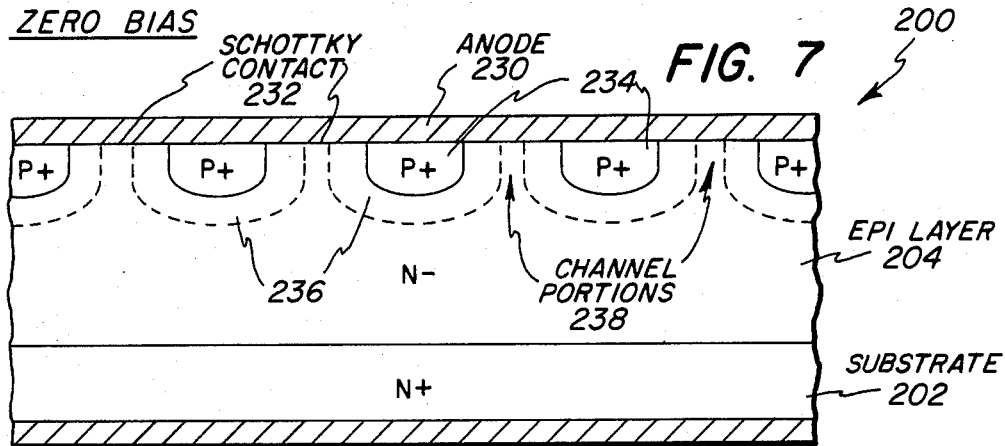
FIG. 7-9 are views similar to FIG. 6 illustrating the electrical condition of the pinch rectifier of FIG. 6 under various conditions of device biasing.

FIG. 7 illustrates operation of pinch rectifier 200 under a zero-biased condition. Extending into expitaxial layer 204 from current pinch-off region portions 234 are respective depletion region portions 236, which are shown as being spaced from each other. Conduction channel portions 238 exist between adjacent pairs of depletion region portions 236; however, these conduction channel portions 238 cannot conduct current through pinch rectifier 200 when it is slightly reverse biased, because Schottky barrier contact portions 232 block current flow for at least low levels of reverse voltages (as discussed further in conjunction with FIG. 9). This permits P+ region portions 234 to be fabricated with less stringent requirements as to the lateral extent of these portions 234 as compared with the lateral extent of P+ region portions 108 of pinch rectifier 100 (FIGS. 1), for the following reason. There exists a tolerance in the spacing of adjacent depletion region portions 236 in the zero-biased condition of pinch rectifier 200. At one extreme, it would be permissible to have adjacent depletion region portions 236 merge, while at the other extreme, adjacent depletion region portions 236 may be spaced as far as possible from each other as long as Schottky barrier contact portions 232 prevent an undesirably high level of reverse leakage current when pinch rectifier 200 is reverse-biased to a degree in which adjacent depletion region portions 236 have not yet merged.

Figure 8:
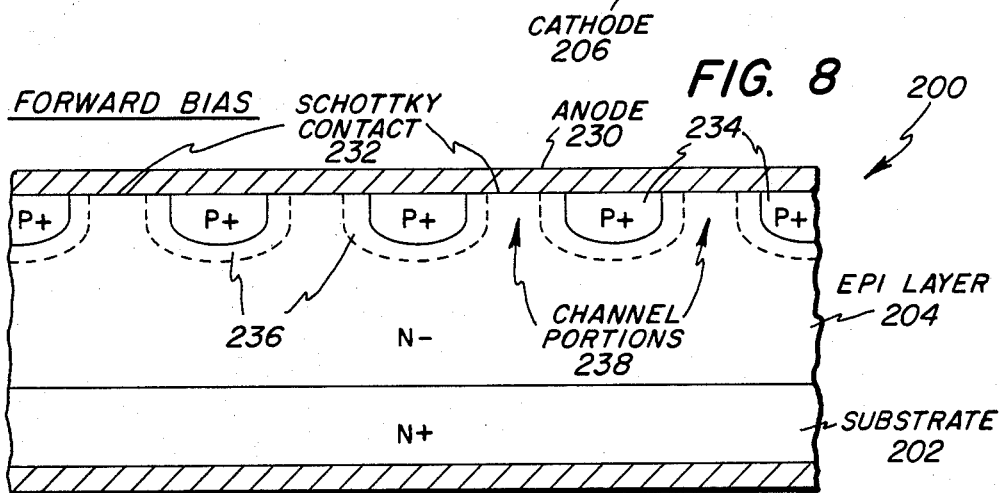

FIG. 8 illustrates operation of pinch rectifier 200 under a forward-biased condition. In such condition, depletion region portions 236 are diminished in size from their size under a zero-biased condition see (FIG. 7). In order for current to flow in conductive channel portions 238, the forward bias voltage on pinch rectifier 200 must exceed a threshold level for overcoming the potential barrier formed by Schottky barrier contact portions 232.

To minimize the forward voltage drop in rectifier 200, it is desirable that the forward threshold voltage required for current conduction in current rectifier 200 be as low as possible. Towards this end, I prefer to utilize techniques for lowering the Schottky barrier height of Schottky barrier contact portions 232. One suitable technique is the Shannon technique. As applied to pinch rectifier 200, a very thin, heavily-doped N conductivity type region (not shown) is provided between anode 230 and N− epitaxial layer 204. A further suitable technique as applied to pinch rectifier 200 involves the creation of surface damage to N− epitaxial layer 204, such as by reactive ion etching. The foregoing techniques are discussed in more detail in the following articles, respectively: J. M. Shannon, "Control of Schottky Barrier Height Using Highly Doped Surface Layers," Solid State Electronics, vol. 19, (1976), pages 537–543; and S. Ashok, T. P. Chow, and B. J. Baliga, "Modification of Schottky Barriers in Silicon by Reactive Ion Etching with NF$_3$," Appl. Phys. Lett., vol. 42, no. 8 (Apr. 15 1983), pages 687–689.

The lowering of the threshold voltage at which pinch rectifier 200 will commence current conduction is not without its costs, however. Specifically, this results in an increase in the reverse leakage current across Schottky barrier rectifying contact portions 232, which is not reduced until adjacent depletion region portions 236 merge together, as depicted in FIG. 9, upon sufficient reverse biasing of rectifier 200.

Figure 9:
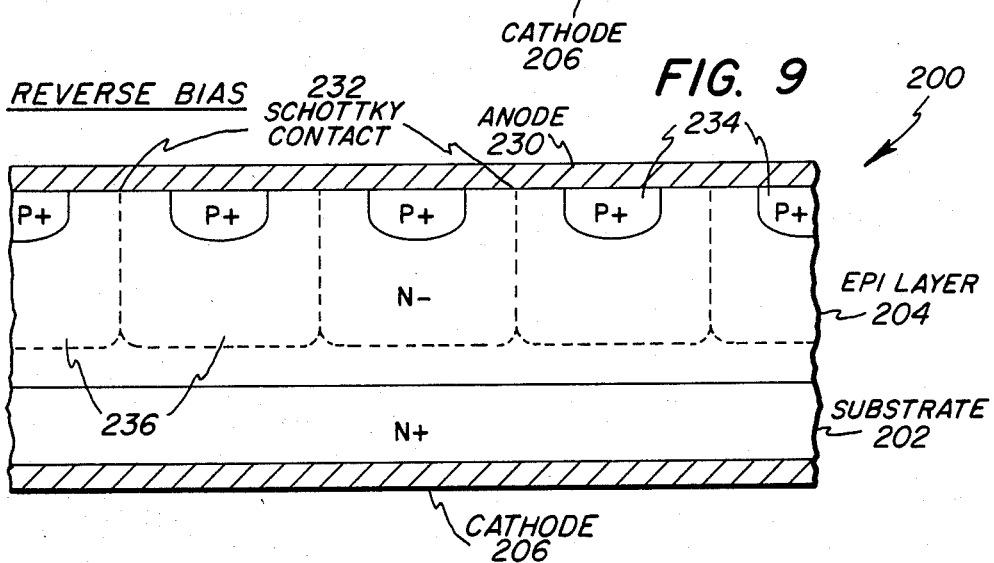

In FIG. 9 the operation of pinch rectifier 200 in a sufficiently reverse-biased condition is illustrated. It can be seen that adjacent depletion region portions 236 are merged together, resulting in pinch-off of conductive channel portions 238 that are shown in FIG. 8. It is permissible for adjacent depletion region portions 236 not to be merged together at lower values of reverse bias, so long as Schottky barrier contact portions 232 then block current flow through pinch rectifier 200.

Turning now to FIG. 10, there is illustrated a pinch rectifier 300 in accordance with a further embodiment of my invention. In rectifier 300, substrate layer 302, epitaxial layer 304, and cathode 306 suitably are essentially identical to substrate layer 102, epitaxial layer 104, and cathode layer 106, respectively, of pinch rectifier 100 (FIG. 1).

In rectifier 300, current pinch-off electrode portions 330 adjoin the upper portion of first epitaxial layer 304 and form Schottky barrier contact portions 331 therewith. A suitable material for implementing current pinch-off electrode portions 330 comprises aluminum or tungsten, by way of example. Second epitaxial layer portions 332 are grown atop first epitaxial layer 304 and, incidentally, over portions of channel pinch-off electrode portions 330, such as at location 334. Anode 336, preferably of deposited aluminum, is provided atop both second epitaxial layer 332 and channel pinch-off electrode portions 330. The upper portions 333 of second epitaxial layer 332 are highly-doped so that anode 336 is ohmically connected to second epitaxial layer 332. This is preferably accomplished before anode 336 is formed over second epitaxial layer 332. In an alternative embodiment (not shown), second epitaxial layer 332 does not have highly-doped portions 333 but, instead, forms a Schottky barrier contact with anode 336.

The operation of pinch rectifier 300 is discussed as follows with reference to FIGS. 11–13.

FIG. 11 depicts operation of the embodiment of pinch rectifier 300 illustrated in FIG. 10 under a zero-biased condition. Depletion region portions 338 extend into both first and second epitaxial layers 304 and 332, respectively, from current pinch-off electrode portions 330, due to the potential barrier existing at the Schottky contact portions 331 between channel pinch-off electrode portions 330 and second epitaxial layer 332. It is preferable that adjacent depletion region portions 338 just barely merge at zero-bias, whereby such regions separate for only low values of forward bias, resulting in a low forward voltage drop. If, on the other hand, adjacent depletion region portions 338 merge only under a reverse biased-condition, a significant level of reverse leakage current results at least until sufficient reverse bias is provided so as to cause adjacent depletion region portions 338 to merge together.

In FIG. 12 the operation of pinch rectifier 300 under a forward-biased condition is illustrated. In this condition, adjacent depletion region portions 338 are separated so that conduction channel portions 340 are not depleted and can thus conduct device current.

FIG. 13 illustrates operation of pinch rectifier 300 under a reverse-biased condition. In this condition, adjacent depletion region portions 338 are merged together, resulting in pinch-off of conduction channel portions 340 that are shown in FIG. 12. In this pinchedoff condition, rectifier 300 cannot conduct current, except for a small reverse leakage current of typically 10 microamperes, at least until the reverse-bias voltage on rectifier 300 exceeds its reverse breakdown voltage.

Turning now to FIG. 14, there is illustrated a pinch rectifier 400 in accordance with an alternative embodiment of my invention. FIG. 14 is partially broken away to facilitate viewing of details thereof. Substrate layer 402 and cathode 406 suitably are essentially identical to substrate layer 102 and cathode 106 of pinch rectifier 100 (FIG. 2). P+ region portions 408 are similar to P+ region portions 108 of pinch rectifier 100 (FIG. 2), except that P+ region portions 408 are buried by the upper part of N− epitaxial layer 404. This is accomplished by forming N− epitaxial layer 404 on substrate 402 in two stages, with formation of P+ region portions 408 occuring after the first stage but before the second stage.

P+ region portions 408 are serially connected to anode 410, as shown diagrammatically by low resistance connection 420. Although not illustrated, in actual implementation of pinch rectifier 400, this is accomplished by forming part of anode 410 directly on part of P+ region portion 408.

Contact 422 between N− epitaxial layer 404 and anode 410 constitutes an ohmic contact if upper part 424 of $N^{31}$ epitaxial layer 404 is of sufficiently low resistivity. Alternatively, it constitutes a Schottky barrier contact if upper part 424 is of a sufficiently high resistivity and the conductive material that implements anode 410 is chosen to form a Schottky barrier contact. The selection of an appropriate resistivity for upper part 424 and of material for anode 410 to implement contact 422 as a Schottky contact will be apparent to those skilled in the art.

Pinch rectifier 400 operates in essentially the same manner as pinch rectifier 100 (FIGS. 1-5) if contact 422 is an ohmic contact, and it operates in essentially the same manner as pinch rectifier 300 (FIGS. 6-9) if contact 422 is a Schottky barrier contact. The basic difference is that in pinch rectifier 400, depletion region portions (not shown) in N− epitaxial layer 404 fully surround P+ region portions 408 rather than only partially surrounding the P+ region portions, as in FIG. 3.

The foregoing describes pinch rectifiers that exhibit low forward voltage drops, and low reverse leakage currents and which constitute high-speed unipolar devices. These pinch rectifiers are accordingly particularly suitable for high-speed power-switching operation.

While my invention has been described with respect to specific embodiments, many modifications and substitutions will be apparent to those skilled in the art. For example, complementary pinch rectifiers could be made, in which P conductivity type material is used rather than N conductivity type material and vise-versa. Further, pinch rectifiers utilizing gallium arsenide or other semiconductor material could be made. It is, therefore, to be understood that the appended claims are intended to cover all such modifications and substitutions as fall within the true spirit and scope of my invention.

What I claim as my invention and desire to secure by Letters Patent by the United States is:

1. A two-terminal rectifier comprising:
   a first semiconductor layer of one conductivity type;
   a first electrode adjoining the underside of said first layer;
   a second semiconductor layer of the one conductivity type disposed atop said first layer but being of higher resistivity than said first layer;
   current pinch-off means adjoining the upper portion of said second layer and including metal electrode portions spaced from each other and making Schottky contact with said second semiconductor layer so as to define between each pair of adjacent portions a respective conduction channel portion in said second layer;
   a second electrode electrically coupled to the upper portion of said second layer and to said current pinch-off means; and
   third semiconductor layer portions of the one conductivity type abuttingly interposed between said second electrode and said second layer, said third layer portions including surface regions of a sufficiently low resistivity adjacent said second electrode that said second electrode is ohmically connected to said second layer and including body portions of higher resistivity adjoining said current pinch-off means; and
   said current pinch-off means being effective to induce depletion region portions extending into said second and third layers from said metal electrode portions of said current pinch-off means;
   said metal electrode portions being spaced sufficiently near each other that adjacent depletion region portions merge together so as to pinch off each conduction channel portion upon biasing of the pinch rectifier with any of a reverse voltage of zero voltage.

2. The pinch rectifier of claim 1 wherein said current pinch-off means is effective to cause said depletion region portions to merge together so as to pinch off each conduction channel portion upon biasing of the pinch rectifier only by a reverse voltage.

3. The pinch rectifier of claim 1 wherein said second electrode directly adjoins said current pinch-off means.

4. The semiconductor device of claim 1 wherein adjacent pairs of said metal electrode portions have opposed surfaces and said opposed surfaces make Schottky barrier contact with said third layer and define further conduction channel portions in said third layer therebetween.

5. The semiconductor device of claim 4 wherein said body portions of high resistivity extend between said metal electrode portions and into each of said further conduction channel portions.

6. The semiconductor device of claim 5 wherein each of said metal electrode portions has an upper surface and said third layer abuts said upper surface.

7. The semiconductor device of claim 6 wherein both said high resistivity and low resistivity portions of said third layer abut said upper surface of said metal electrode portions.

8. The semiconductor device of claim 1 wherein each opposed surface of said metal electrode portions of said current pinch off means establishes a depletion region, coextensive with said each opposed surface of said metal electrode portions.

9. The semiconductor device of claim 1 wherein said metal electrode portions comprise metal selected from the group consisting of aluminum or tungsten.

10. The semiconductor device of claim 9 wherein said second electrode contacts said third layer and said current pinch off means.

11. A pinch rectifier comprising:

a body of semiconductor of one type conductivity material having first and second surfaces;

a first electrode ohmically contacting said body on said first surface;

a plurality of discrete metal electrode portions disposed in spaced relation on said second surface and making Schottky barrier engagement therewith;

said body further including an epitaxial layer of one type conductivity disposed on and making ohmic contact with said second surface of said semiconductor body and being contiguous with and making Schottky contact with said plurality of discrete metal electrode portions; and a second electrode ohmically contacting said epitaxial layer and said plurality of discrete metal electrode portions;

said plurality of discrete metal electrode portions defining channel regions therebetween in said body such that under zero or reverse bias conditions, depletion regions formed by said metal electrode portions extend throughout each of said channel regions to block current flow through said channel regions.

12. The pinch rectifier of claim 11 wherein said epitaxial layer includes a high resistivity portion in Schottky contact with said metal electrode portions and a low resistivity portion in ohmic contact with said second electrode.

13. The pinch rectifier of claim 12 wherein said metal electrode portions comprise a metal selected from the class consisting of aluminum or tungsten and said second electrode comprises aluminum.

14. The pinch rectifier of claim 11, wherein adjacent pairs of said metal electrode portions have opposed surfaces.

15. The pinch rectifier of claim 14, wherein each opposed surface establishes a depletion region coextensive with said opposed surface.

* * * * *